United States Patent [19]

Tohyama

[11] Patent Number: 5,684,323
[45] Date of Patent: Nov. 4, 1997

[54] PROTECTION CIRCUIT FOR SEMICONDUCTOR DEVICE

[75] Inventor: Shigeru Tohyama, Tokyo, Japan

[73] Assignee: NEC Corporation, Tokyo, Japan

[21] Appl. No.: 572,721

[22] Filed: Dec. 14, 1995

[30] Foreign Application Priority Data

Dec. 14, 1994 [JP] Japan .................... 6-333057

[51] Int. Cl.⁶ .................... H01L 27/02; H01L 29/04
[52] U.S. Cl. .................... 257/363; 257/380; 257/538
[58] Field of Search .................... 257/355, 356, 257/358, 359, 360, 363, 379, 380, 537, 538

[56] References Cited

U.S. PATENT DOCUMENTS 5,187,559  2/1993  Isobe et al. .................... 257/538
5,489,547  2/1996  Erdeljac et al. .................... 437/60
5,504,361  4/1996  Blossfeld .................... 257/355

OTHER PUBLICATIONS

LSI Handbook (1984), p. 679.

*Primary Examiner*—Donald L. Monin, Jr.
*Attorney, Agent, or Firm*—Whitham, Curtis, Whitham & McGinn

[57] ABSTRACT

In a semiconductor device adapted to be driven while being cooled in operation and having one input/output terminal to which an element to be protected is connected, a protection circuit consists of a protection element electrically connected between the input/output terminal and a semiconductor substrate. This protection element has no polarity in a current-to-voltage characteristic but has a negative temperature coefficient of resistivity. The protection element exhibits a low resistance at a room temperature but becomes insulative or exhibits a high resistance at an operating temperature of the semiconductor device.

8 Claims, 7 Drawing Sheets

FIGURE 8

PROTECTION CIRCUIT FOR SEMICONDUCTOR DEVICE

BACKGROUND OF THE INVENTION

1. Field of the Invention

The present invention relates to a protection circuit for a semiconductor device, and more specifically to a protection circuit for preventing an electrostatic breakdown in a semiconductor device driven while being cooled by a cooling means.

2. Description of Related Art

Conventionally, in a semiconductor device driven while being cooled by a cooling means, there has been used a protection circuit similar to that used in a semiconductor device driven at a room temperature.

Figure 1:
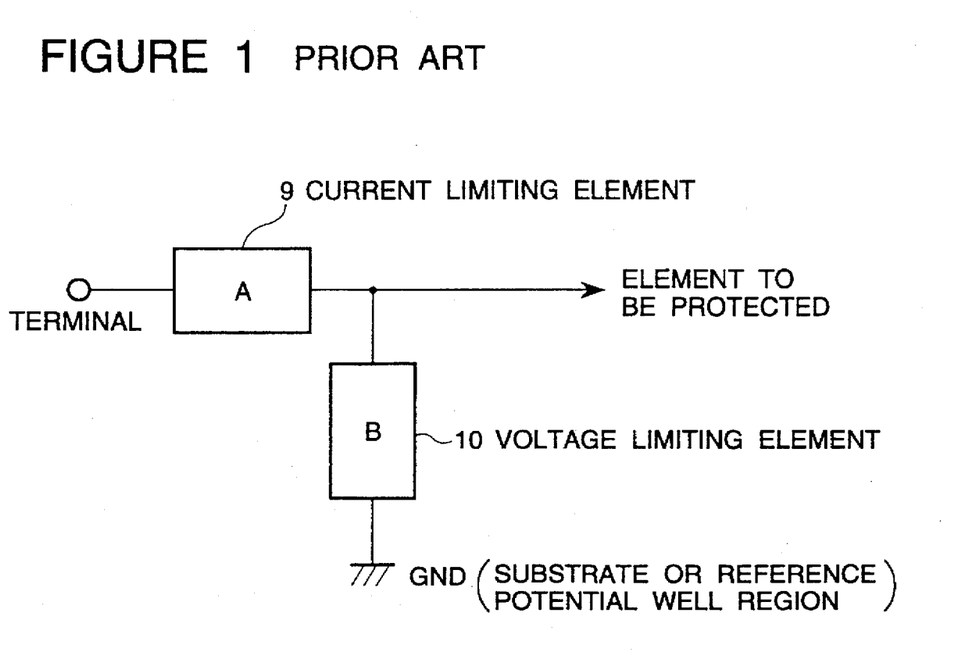
FIG. 1 is a block diagram of one example of a conventional protection circuit provided between an input/output terminal and an element to be protected.

Referring to FIG. 1, there is shown one example of a conventional protection circuit provided to an input/output terminal or a wiring conductor connected thereto.

Figure 2:
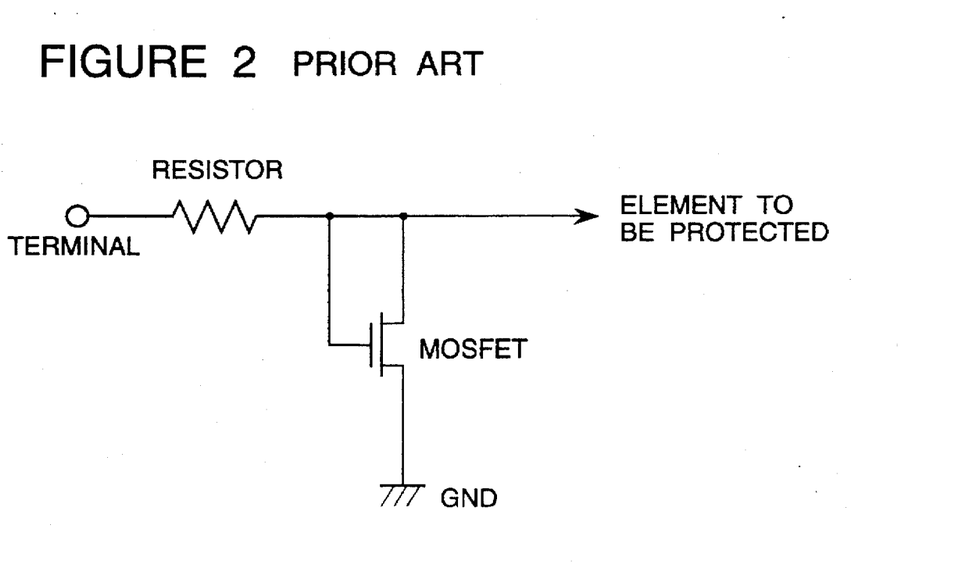
FIG. 2 is a circuit diagram showing a specific example of the circuit shown in FIG. 1.

In the protection circuit shown in FIG. 1, Reference Numeral 9 designates a current limiting element A connected between an input/output terminal and an element to be protected. This current limiting element A is constituted of a resistor, which is formed of for example a semiconductor film doped with impurity at a high concentration, or a diffused layer formed by diffusing a high concentration of impurities into a semiconductor substrate or in a reference potential well region. On the other hand, Reference Numeral 10 designates a voltage limiting element B, which is connected between the element to be protected and ground or the reference potential well region, and which is formed of a diode or a transistor. Therefore, specifically, as one example, the circuit shown in FIG. 1 is formed as a circuit shown in FIG. 2.

Figure 3:
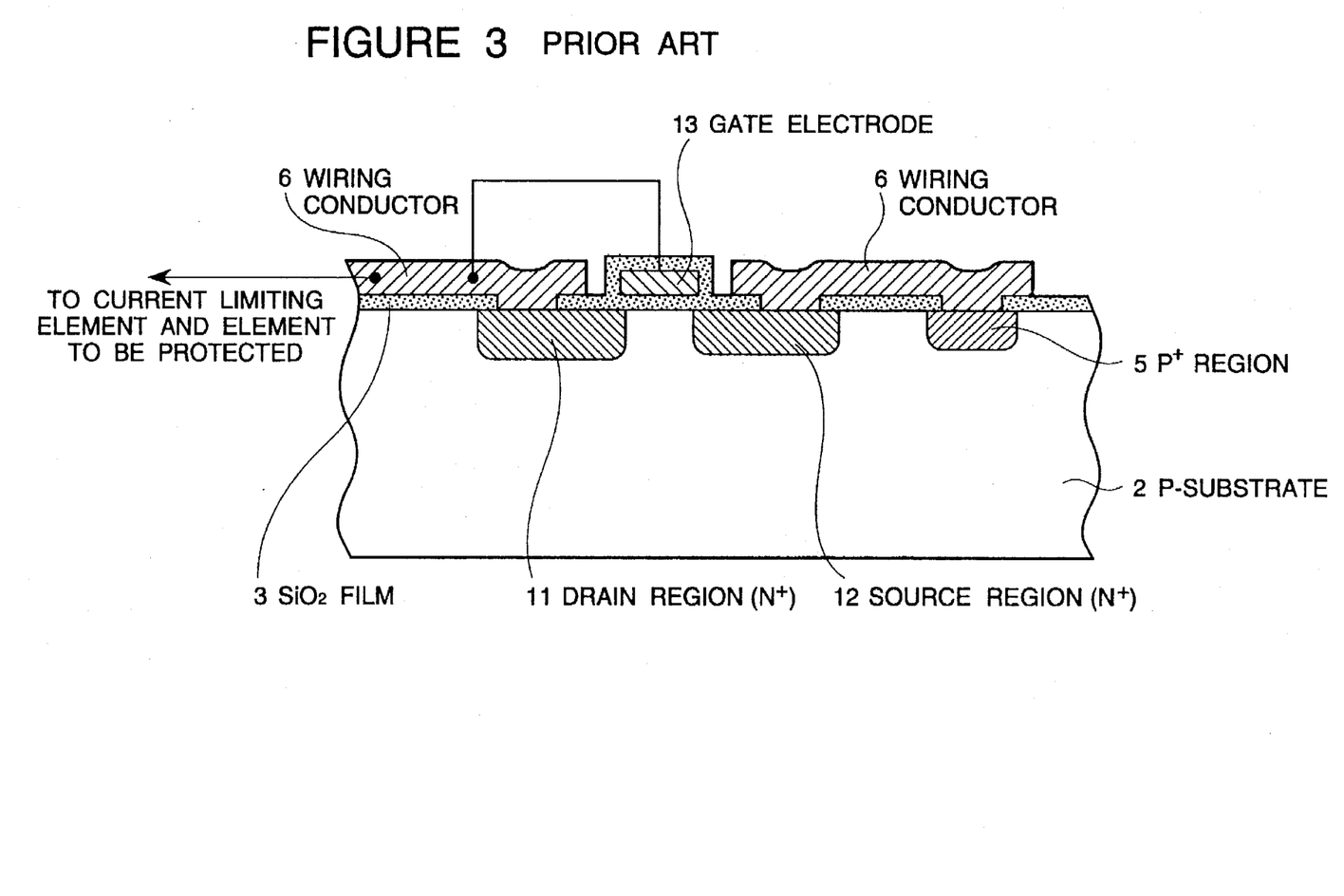
FIG. 3 is a diagrammatic section view of the MOSFET shown in FIG. 2.

Referring to FIG. 3, there is shown a diagrammatic section view of a transistor connected, as the voltage limiting element B, between the wiring conductor connected to the input/output terminal (namely, the element to protected) and the ground (the substrate or the reference potential well region).

The shown transistor includes an $N^+$ drain region 11, an $N^+$ source region 12, and a $P^+$ region 5 formed in a P-type silicon substrate 2, which is covered with an $SiO_2$ film 3. A gate electrode 13 is formed on the $SiO_2$ film 3 (gate oxide) above a substrate region between the drain region 11 and the source region 12, and a wiring conductor 6 is also formed on the $SiO_2$ film 3 so as to connect to the drain region 11 through a contact hole formed through the $SiO_2$ film 3. This wiring conductor 6 is connected to the gate electrode 13 and the wiring conductor connected to the input/output terminal. Another wiring conductor 6 is formed on the $SiO_2$ film 3 so as to interconnect the source region 12 and the $P^+$ region 5, as shown, through contact holes formed through the $SiO_2$ film 3.

The transistor is depicted in FIG. 3, but focussing attention to the the $N^+$ drain region 11 connected to the wiring conductor 6 connected to the input/output terminal, a diode is formed by the $N^+$ drain region 11 and the substrate 2.

In the case that the diode or the transistor is directly formed in the semiconductor substrate as shown in FIG. 3 or the reference potential well region, it is disadvantageous since it is not possible to treat a bias voltage, a drive signal or an output signal which has a forward direction directed toward the semiconductor substrate or the reference potential well region. In the example shown in FIG. 3, since the silicon substrate 2 is of the P type and the drain region 11 is of the $N^+$ type as mentioned above, it is not possible to apply a negative voltage to the input/output terminal, assuming that the silicon substrate potential is a reference potential.

Figure 4:
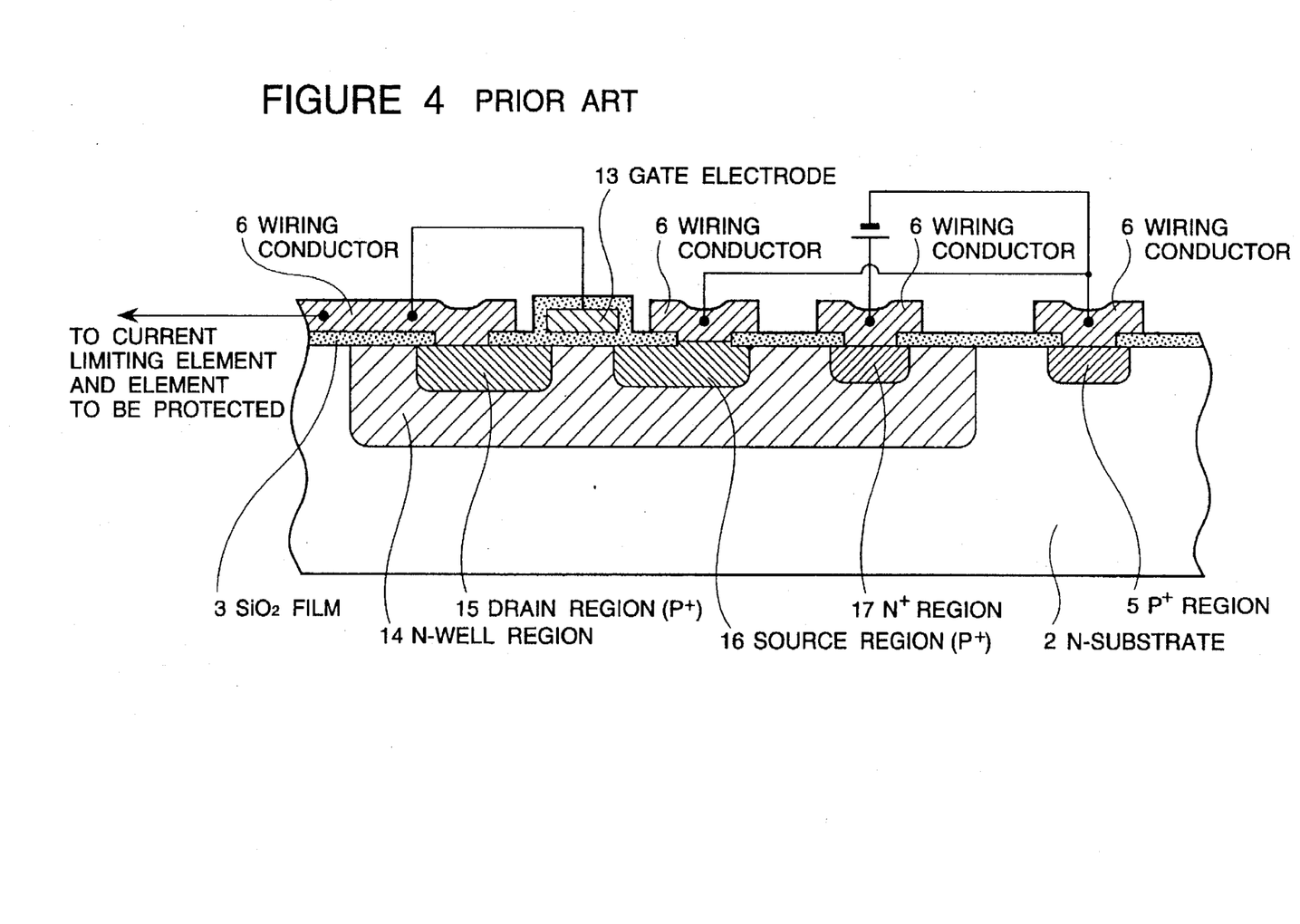
FIG. 4 is a diagrammatic section view of an example in which it is possible to apply both a positive voltage and a negative voltage to the input/output terminal, assuming that a potential of the silicon substrate is a reference potential.

Referring to FIG. 4, there is shown a diagrammatic section view of an example in which it is possible to apply both a positive voltage and a negative voltage to the input/output terminal, assuming that a potential of the silicon substrate or the reference potential well region is a reference potential. In FIG. 4, element similar to those shown in FIG. 3 are given the same Reference Numerals.

The circuit shown in FIG. 4 includes an N-type well region 14 and a $P^+$ region 5 formed in a P-type silicon substrate 2. A $P^+$ drain region 15, a $P^+$ source region 16 and an $N^+$ region 17 are formed in the N-type well region 14. A principal surface of the substrate is covered with an $SiO_2$ film 3. A gate electrode 13 is formed on the $SiO_2$ film 3 (gate oxide) above a substrate region between the drain region 15 and the source region 16, and a wiring conductor 6 is also formed on the $SiO_2$ film 3 so as to connect to the drain region 15, the source region 16, the $N^+$ region 17 and the $P^+$ region 5 through contact holes formed through the $SiO_2$ film 3, respectively. The wiring conductor 6 connected to the drain region 15 is connected to the gate electrode 13 and the input/output terminal or the wiring conductor connected thereto (namely, the element to protected). The wiring conductor 6 connected to the source region 16 is connected to the wiring conductor 6 connected to the $P^+$ region 5, and the wiring conductor 6 connected to the $N^+$ region 17 is biased positive in comparison with the wiring conductor 6 connected to the $P^+$ region 5.

As seen from FIG. 4, in order to protect the input/output terminal applied with both a positive voltage and a negative voltage, assuming that a potential of the silicon substrate or the reference potential well region is a reference potential, it is necessary to form a well structure and to apply a bias voltage to the well.

In the example shown in FIG. 4, since the silicon substrate 2 is of the P type, and the well region 14 is of the N type and the drain region 15 is of the $P^+$ type as mentioned above, by applying a positive bias to the well region 14, it is possible to protect against both the positive voltage and the negative voltage applied to the input/output terminal, within an upper limit corresponding to the voltage of the positive bias.

However, the circuit shown in FIG. 4 requires a terminal for applying the bias voltage to the well region, in addition to the input/output terminal inherently required in the semiconductor device. Therefore, this results in an increased number of pins in a package, in an increased size of the package, and in an increased number of external wirings. The increase of the package increases a thermal or heat capacity, and the increased number of external wirings results in an increased mount of heat transferring to the semiconductor device from an external. As a result, this type of protection circuit lowers a cooling efficiency of the semiconductor device driven while being cooled by a cooling means.

SUMMARY OF THE INVENTION

Accordingly, it is an object of the present invention to provide a protection circuit for a semiconductor device, which has overcome the above mentioned defect of the conventional one.

Another object of the present invention is to provide a protection circuit for a semiconductor device driven while being cooled by a cooling means, capable of protecting against both the positive voltage and the negative voltage applied to the input/output terminal, without lowering a cooling efficiency of the semiconductor device.

Still another object of the present invention is to provide a protection circuit for a semiconductor device driven while being cooled by a cooling means, capable of protecting against both the positive voltage and the negative voltage applied to the input/output terminal, with requiring no bias voltage applied for the protection circuit.

The above and other objects of the present invention are achieved in accordance with the present invention by a protection circuit for a semiconductor device adapted to be driven while being cooled by a cooling means, the semiconductor device having at least one input/output terminal to which an element to be protected is connected, the protection circuit consisting of a protection element means electrically connected between the at least one input/output terminal and one of a semiconductor substrate and a reference potential well region formed in the semiconductor substrate, the protection element means having no polarity in a current-to-voltage characteristic and having a negative temperature coefficient of resistivity, the protection element means exhibiting a low resistance at a room temperature and becoming insulative or exhibiting a high resistance at an operating temperature of the semiconductor device which is lower than the room temperature.

In one embodiment, the protection element means consists of a resistor formed of a semiconductor doped with impurity which forms an energy level different from an end of an energy band by not less than 0.1 eV.

In another embodiment, the one of a semiconductor substrate and a reference potential well region is of a first conductivity type, and the protection element means consists of two Schottky diodes formed on an impurity-doped well which is formed in the one of a semiconductor substrate and a reference potential well region and which is of a second conductivity type opposite to the first conductivity type, the two Schottky diodes being connected in series with each other but having a forward direction in a direction opposite to each other.

With the above mentioned arrangement, the protection circuit in accordance with the present invention for the semiconductor device effectively utilizes the fact that in operation, the semiconductor device is cooled.

Electrostatic break of gate electrodes and others in a semiconductor device occurs in assembling and packaging processes, and after packaged, when the semiconductor device is put in operation, since input/output terminals are connected to an external circuit, the electrostatic break does not occur. Therefore, in connection with a semiconductor device driven while being cooled by a cooling means, there is no problem in limiting the protection of internal circuits (including gate electrodes) of the semiconductor device from the electrostatic break, to a room temperature environment in which the assembling and packaging processes are carried out.

In the protection circuit in accordance with the present invention for the semiconductor device, since the protection element means having no polarity in a current-to-voltage characteristic and a negative temperature coefficient of resistivity, and exhibiting a low resistance at a room temperature and becoming insulative or exhibiting a high resistance at an operating temperature of the semiconductor device, is electrically connected between the input/output terminal (or a wiring conductor connected thereto) and one of a semiconductor substrate and a reference potential well region formed in the semiconductor substrate. Therefore, at the room temperature, even if an electric shock is applied to the input/output terminal or the wiring conductor connected thereto and an internal circuit element (such as a gate electrode) connected to the wiring conductor, the electric shock is discharged through the protection element means having the low resistance to either the semiconductor substrate or the reference potential well region formed in the semiconductor substrate, regardless of whether the electric shock is positive or negative. On the other hand, at an operating temperature which is realized by the cooling means to be lower than the room temperature, since the protection element means becomes insulative or exhibiting a high resistance, the input/output terminal or the wiring conductor connected thereto is substantially electrically isolated from the semiconductor substrate or the reference potential well region formed in the semiconductor substrate.

Accordingly, the protection circuit in accordance with the present invention makes it impossible to apply or obtain an electric signal to or from the input/output terminal at a room temperature, but exhibits a protection effect against the static electricity at the room temperature. On the other hand, at the operating temperature, the protection effect disappears, and it becomes possible to apply or obtain an electric signal to or from the input/output terminal. Accordingly, the protection circuit in accordance with the present invention can sufficiently functions as a protection circuit for a semiconductor device driven while being cooled by a cooling means.

In addition, since the protection element means having no polarity in a current-to-voltage characteristic, it is possible to treat an electric signal having both a positive polarity and a negative polarity, and also, it is no longer necessary to apply a bias voltage. Therefore, an extra terminal for the bias voltage is not necessary, so that the number of external terminals and the size of the semiconductor device can be reduced, resulting in preventing the drop of the cooling efficiency.

The above and other objects, features and advantages of the present invention will be apparent from the following description of preferred embodiments of the invention with reference to the accompanying drawings.

DESCRIPTION OF THE PREFERRED EMBODIMENTS

Figure 5:
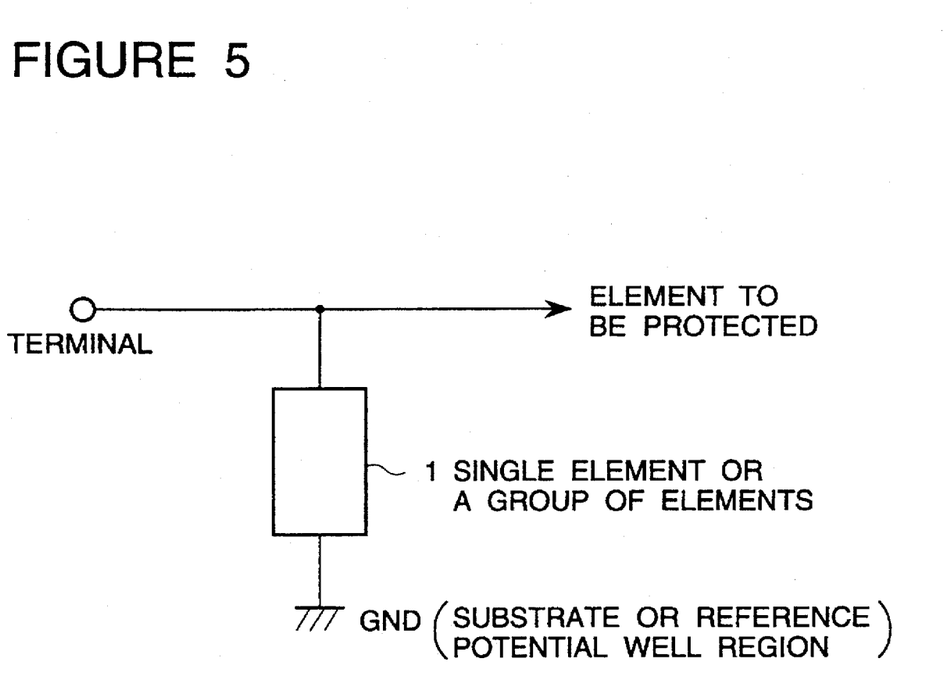
FIG. 5 is a block diagram of a protection circuit in accordance with the present invention, connected to an input/output terminal and an element to be protected.

Referring to FIG. 5, there is shown a block diagram of a protection circuit, in the simplest form, in accordance with the present invention, connected to an input/output terminal and an element to be protected.

The shown protection circuit includes a protect element means 1, which consists of a single circuit element or a group of circuit elements, and which is connected between ground (a semiconductor substrate or a reference potential well region formed in the semiconductor substrate) and a wiring conductor extending from an input/output terminal to an element to be protected. This protect element means 1 has no polarity in a current-to-voltage characteristic but has a negative temperature coefficient of resistivity, and also exhibits a low resistance at a room temperature but becomes insulative or exhibits a high resistance at an operating temperature of the semiconductor device, which is lower than the room temperature.

Figure 6A:
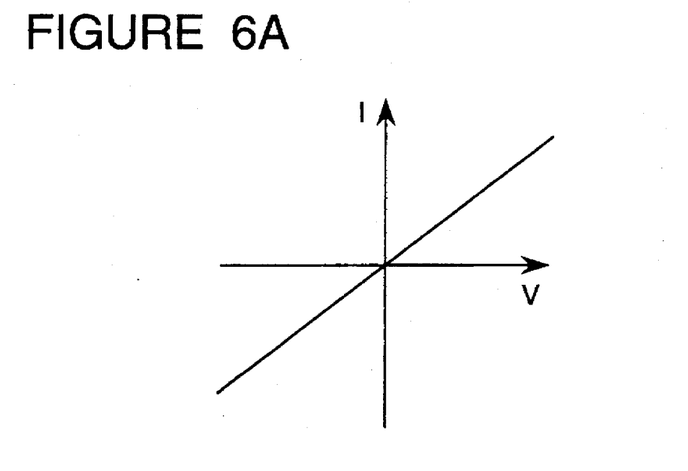
FIGS. 6A, 6B and 6C, are graphs illustrating a current-to-voltage characteristic of the protection element incorporated in the protection circuit in accordance with the present invention.
Figure 6B:
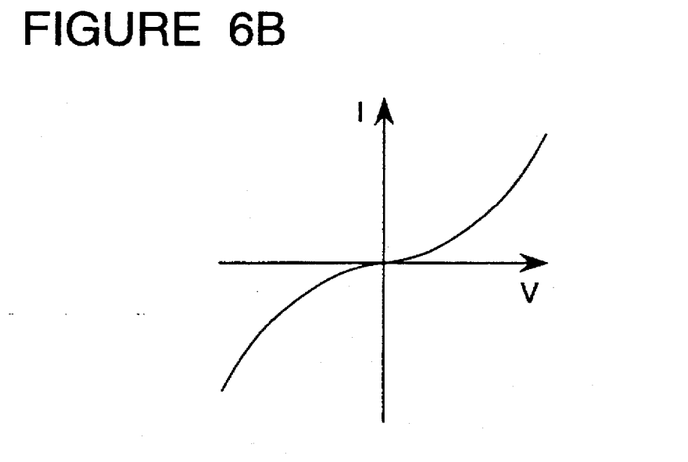
Figure 6C:
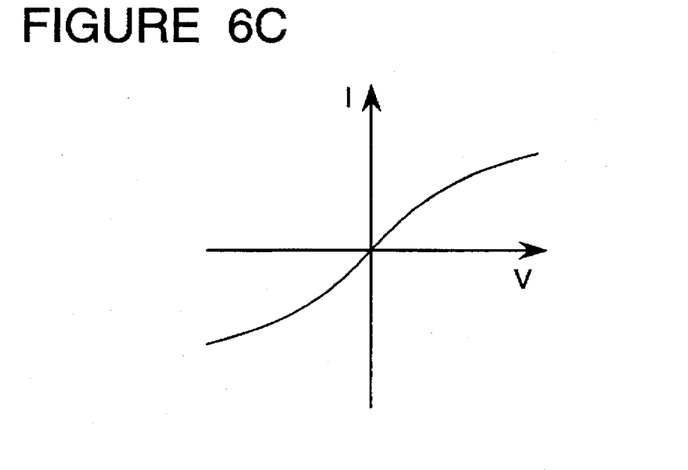

The protect element means 1 may have a linear current-to-voltage characteristic as shown in FIG. 6A or a non-linear current-to-voltage characteristic as shown in FIGS. 6B and 6C, if a clear polarity does not exist in the current-to-voltage characteristic. In addition, since the protect element means 1 has the negative temperature coefficient of resistivity, the resistance of the protect element means increases with cooling-down, and becomes insulative or exhibits a high resistance at an operating temperature of the semiconductor device, which is lower than the room temperature. For example, when the temperature reaches a liquid nitrogen temperature (77 K.) which is an operating temperature of an infrared image sensor having a photoreception part constituted of a PtSi/P-type Si Schottky diode, the current-to-voltage characteristic becomes I=0, namely, consistent with the axis of abscissas in the graph.

Therefore, even if a static electricity is applied to the input/output terminal at a room temperature, the static electricity is discharged through the protect element means 1 having the low resistance to the ground (the semiconductor substrate or the reference potential well region formed in said semiconductor substrate). Accordingly, the static electricity does not reach the element to be protected, so that the element to be protected is actually protected from the electrostatic break. On the other hand, at an operating temperature of the semiconductor device which is lower than the room temperature, since the protect element means 1 becomes insulative or exhibits a high resistance, the input/output terminal and hence the element to be protected are electrically isolated from the ground (the semiconductor substrate or the reference potential well region formed in said semiconductor substrate), by the insulative or high resistance protect element means 1, and therefore, an electric signal having both a positive polarity and a negative polarity can be supplied and extracted from the input/output terminal.

The protection circuit shown in FIG. 5 can be modified to have a current limiting element inserted between the input/output terminal and a connection node to which the protection element means 1 is connected, and a voltage limiting element inserted in series between the ground and the protection element means 1.

This modified circuit would have the same electrostatic break protection effect similar to that of the conventional example shown in FIG. 1 at a room temperature. However, at an operating temperature of the semiconductor device which is lower than the room temperature, since the voltage limiting element is electrically isolated together with the ground (the semiconductor substrate or the reference potential well region formed in said semiconductor substrate) from the input/output terminal, the current limiting element and the element to be protected, by the insulative or high resistance protect element means 1, although neither a well structure is adopted nor is a bias voltage applied, an electric signal having both a positive polarity and a negative polarity can be supplied and extracted from the input/output terminal.

Figure 7:
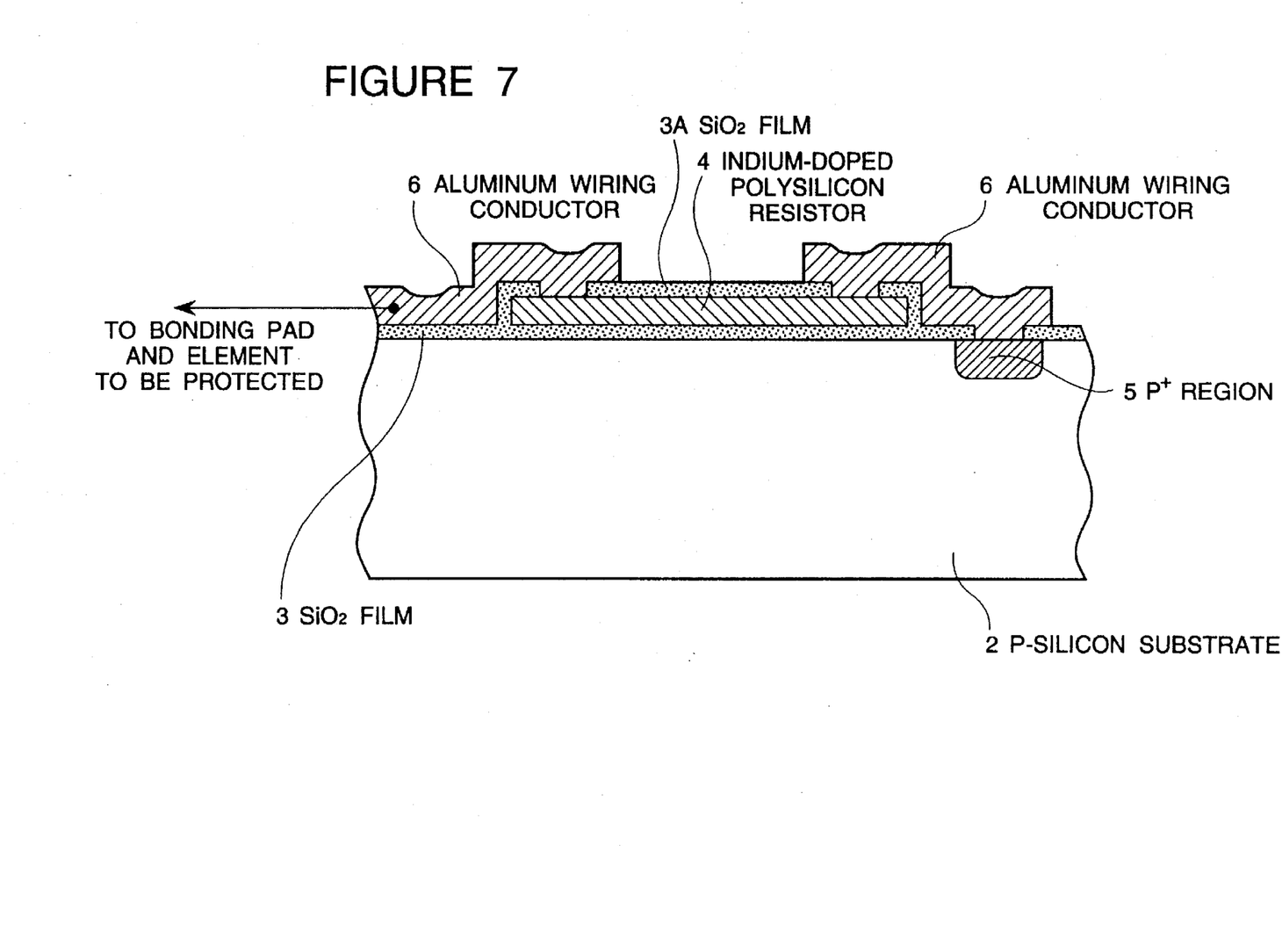
FIG. 7 is a diagrammatic section view of one example of the protection element incorporated in the protection circuit in accordance with the present invention.

Referring to FIG. 7, there is shown a diagrammatic section view of one example of the protection element incorporated in the protection circuit in accordance with the present invention.

In the example shown in FIG. 7, the protect element means 1 which has no polarity in a current-to-voltage characteristic but has a negative temperature coefficient of resistivity, and which exhibits a low resistance at a room temperature but becomes insulative or exhibits a high resistance at an operating temperature of the semiconductor device, consists of a resistor formed of a semiconductor doped with impurity which forms an energy level different from an end of an energy band by not less than 0.1 eV.

Specifically, on a principal surface of a P-type silicon substrate 2, an $SiO_2$ film 3 is formed, and an indium-doped polysilicon resistor 4 is formed on the $SiO_2$ film 3. The indium is a P-type impurity forming, in silicon, an energy level separated from a valence band by 0.16 eV. The indium-doped polysilicon resistor 4 is covered with another $SiO_2$ film 3A.

In addition, the P-type silicon substrate 2 has a $P^+$ region 5 formed in the principal surface for an ohmic contact to the substrate. A contact hole is formed at two separated positions in the $SiO_2$ film 3A on the indium-doped polysilicon resistor 4 and in the $SiO_2$ film 3 on the $P^+$ region 5. An aluminum wiring conductor 6 is formed to interconnect one end of the indium-doped polysilicon resistor 4 and the $P^+$ region 5, and to connect the other end of the indium-doped polysilicon resistor 4 to a bonding pad (input/output terminal) and an element to be protected. Furthermore, the whole surface is coated with a passivation film (not shown).

In the case that a high concentration of boron is doped to a portion of the indium-doped polysilicon resistor 4 contacted with the aluminum wiring conductor 6, the current-to-voltage characteristic of the shown protection element becomes as shown in FIG. 6A. In the case that a high concentration of boron is not doped to the portion of the indium-doped polysilicon resistor 4 contacted with the aluminum wiring conductor 6, the current-to-voltage characteristic of the shown protection element becomes as shown in FIG. 6B.

For example, the concentration of the indium contained in the indium-doped polysilicon resistor 4 is $1 \times 10^{16}$ $cm^{-3}$. In this case, dependently upon the grain diameter of the polysilicon to some degree, the resistivity is on the order of 2 $\Omega cm$ at a room temperature, but becomes 40 $K\Omega cm$ at a liquid nitrogen temperature (77 K.). For example, if the indium-doped polysilicon resistor 4 has a thickness of 500 nm, a width of 5 μm and a contact-to-contact distance of 100 μm, the resistor exhibits a resistance of 800 $\Omega$ at a room temperature but 16 $G\Omega$ at a liquid nitrogen temperature (77 K.). Under this condition, if a voltage of 10 V is applied to the input/output terminal, a current of 12.5 μA flows at a room temperature, but only a current of 625 p A flows at a liquid nitrogen temperature (77 K.).

In place of the indium-doped polysilicon, the resistor 4 can be formed of for example a sulfur-doped polysilicon.

Since sulfur is an N-type impurity forming, in silicon, an energy level separated from a conduction band by 0.18 eV, it is sufficient if a high concentration of phosphorus is doped into a contact portion, in order to obtain the current-to-voltage characteristics as shown in FIG. 6A. Alternatively, the resistor 4 can be advantageously formed of for example a sulfur (donor, 0.18 eV)-doped germanium or a selenium (donor, 0.14 eV)-doped germanium. In addition, of course, it is possible to use any other impurity which forms an energy level different from an end of an energy band by not less than 0.1 eV.

Figure 8:
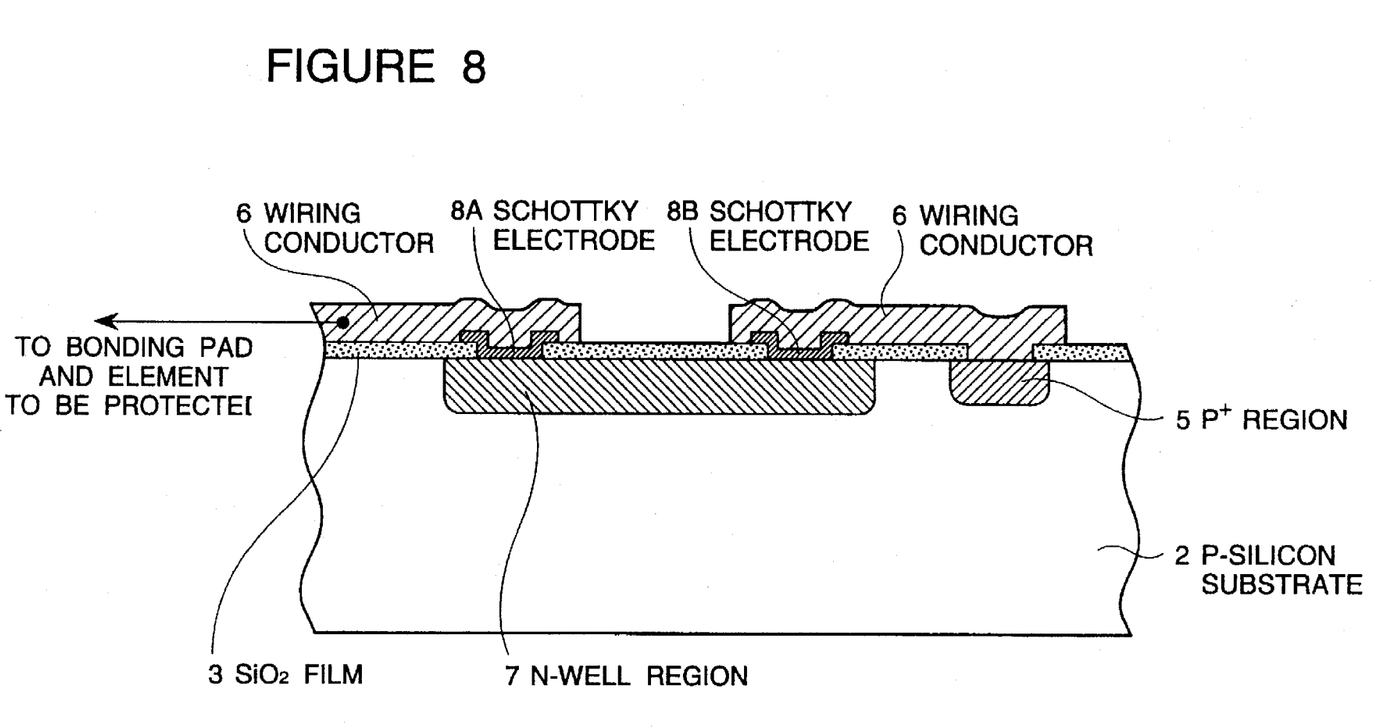
FIG. 8 is a diagrammatic section view of another example of the protection element incorporated in the protection circuit in accordance with the present invention.

Referring to FIG. 8, there is shown a diagrammatic section view of another example of the protection element incorporated in the protection circuit in accordance with the present invention.

In the example shown in FIG. 8, assuming that the semiconductor substrate (or the reference potential well region) is of a first conductivity type, the protect element means 1 which has no polarity in a current-to-voltage characteristics but has a negative temperature coefficient of resistivity, and which exhibits a low resistance at a room temperature but becomes insulative or exhibits a high resistance at an operating temperature of the semiconductor device, consists of two Schottky diodes formed on an impurity-doped well which is formed in the semiconductor substrate (or the reference potential well region) and which is of a second conductivity type opposite to said first conductivity type, the two Schottky diodes being connected in series with each other but having a forward direction in a direction opposite to each other.

Specifically, in a principal surface region of a P-type silicon substrate 2, there are formed an N-type well region 7 and a P$^+$ region 5 formed for an ohmic contact to the substrate. The principal surface of the P-type silicon substrate 2 is coated with an SiO$_2$ film 3. A contact hole is formed at two separated positions in the SiO$_2$ film 3 on the N-type well region 7 and in the SiO$_2$ film 3 on the P$^+$ region 5. A pair of Schottky electrodes 8A and 8B forming a Schottky contact with silicon, are formed in the contact holes formed in the SiO$_2$ film 3 on the N-type well region 7. Aluminum wiring conductor 6 is formed to interconnect one of the pair of Schottky electrodes 8B and the P$^+$ region 5, and to connect the other Schottky electrode 8A to a bonding pad (input/output terminal) and an element to be protected. Furthermore, the whole surface is coated with a passivation film (not shown).

As seen from FIG. 8, the Schottky diode formed of the Schottky electrode 8A is connected in series with the Schottky diode formed of the Schottky electrode 8B, so as to have a forward direction opposite to each other.

The Schottky electrodes 8A and 8B are formed of for example molybdenum or molybdenum silicide (MoSi$_2$) which can be obtained by causing the molybdenum and the silicon substrate to react in a solid phase by a heat-treatment. A Schottky barrier formed between the molybdenum and the N-type silicon is 0.56 eV, and a Schottky barrier formed between the molybdenum silicide and the N-type silicon is 0.55 eV.

Since the Schottky barriers are substantially the same, the following explanation will be made assuming that the Schottky electrodes 8A and 8B are formed of molybdenum silicide (MoSi$_2$). In these Schottky diodes, a backward direction saturation current density is on the order of 6 mA/cm$^2$ at a room temperature, but is estimated on the order of $7 \times 10^{-31}$ at a liquid nitrogen temperature (77 K.). Assuming that an area of the Schottky contact of each Schottky diode is 300 μm☐ for example, a current of 5.4 μA flows at a room temperature, but a current of $6.3 \times 10^{-34}$ A flows at the liquid nitrogen temperature (77 K.). This current of $6.3 \times 10^{31-34}$ A corresponds to the fact that only one electron flows for a period of eight million years. Accordingly, the current at the liquid nitrogen temperature (77 K.) is zero (0).

In the structure shown in FIG. 8, when a terminal side (connected to the bonding pad and the element to be protected) becomes a positive potential, the terminal side Schottky diode (formed by the Schottky electrode 8A) becomes a forward direction, but a PN junction formed between the N-type well 7 and the P-type substrate 2 becomes a backward direction, and also the ground side Schottky diode (formed by the Schottky electrode 8B and connected to the P$^+$ region 5) becomes a backward direction. Therefore, assuming that an internal circuit is isolated from the input/output terminal, the current-to-voltage characteristic from the input/output terminal to the P-type substrate 2 becomes almost a backward direction characteristic of one Schottky diode.

On the other hand, when the terminal side (connected to the bonding pad and the element to be protected) becomes a negative potential, the PN junction formed between the N-type well 7 and the P-type substrate 2 becomes a forward direction, and the ground side Schottky diode (connected to the P$^+$ region 5) becomes a forward direction, but the terminal side Schottky diode (formed by the Schottky electrode 8A) becomes a backward direction. Therefore, assuming that an internal circuit is isolated from the input/output terminal, the current-to-voltage characteristic from the input/output terminal to the P-type substrate 2 also becomes almost a backward direction characteristics of one Schottky diode.

Accordingly, in the structure shown in FIG. 8, the input/output terminal can be electrically connected to the P-type substrate 2 through a definite resistance at a room temperature, but is completely isolated from the P-type substrate 2 at a liquid nitrogen temperature (77 K.). Therefore, the an electric signal having both a positive polarity and a negative polarity can be received on or outputted from the input/output terminal.

If a backward direction breakdown voltage is not sufficient in the structure shown in FIG. 8, the backward direction breakdown voltage can be improved by providing a P-type guard ring in a region of the N-type well 7 surrounding the Schottky electrodes 8A and 8B. If the material of the Schottky electrode is suitably selected on the basis of the operating temperature of the semiconductor device, the kind and the conductivity type of the semiconductor material, the structure shown in FIG. 8 can be applied in wide range of application.

As seen from the above, in the protection circuit in accordance with the present invention for the semiconductor device, at a room temperature where an internal circuit element such as a gate electrode is to be protected from a static electricity, the input/output terminal and the wiring conductor connected thereto are connected through a low resistance to the semiconductor substrate or the reference potential well region formed in the semiconductor substrate, so that an electric shock can be discharged to the semiconductor substrate or the reference potential well region formed in the semiconductor substrate. At an operating temperature of the semiconductor device which is sufficiently lower than the room temperature, the input/output terminal and the wiring conductor connected thereto are substantially electrically disconnected from the semiconductor substrate or the reference potential well region formed in the semiconductor substrate. Therefore, an electric signal having both a positive polarity and a negative polarity can be supplied to and from the input/output terminal.

In addition, since it is no longer necessary to apply a bias voltage to the protection circuit, an extra terminal for the bias voltage is not necessary, so that the number of external terminals, the number of external wiring conductors and the size of the semiconductor device can be reduced, and therefore, the semiconductor device having a high cooling efficiency can be realized.

The invention has thus been shown and described with reference to the specific embodiments. However, it should be noted that the present invention is in no way limited to the details of the illustrated structures but changes and modifications may be made within the scope of the appended claims.

I claim:

1. A protection circuit for a semiconductor device adapted to be driven while being cooled by a cooling means, the semiconductor device having at least one input/output terminal to which an element to be protected is connected, the protection circuit consisting of a protection element means electrically connected between said at least one input/output terminal and one of a semiconductor substrate and a reference potential well region formed in said semiconductor substrate, said protection element means having no polarity in a current-to-voltage characteristic and having a negative temperature coefficient of resistivity, said protection element means exhibiting a low resistance at a room temperature and becoming insulative or exhibiting a high resistance at an operating temperature of the semiconductor device which is lower than said room temperature.

2. A protection circuit claimed in claim 1 wherein said protection element means consists of a resistor formed of a semiconductor doped with impurity which forms an energy level different from an end of an energy band by not less than 0.1 eV.

3. A protection circuit claimed in claim 2 wherein said resistor is formed of one selected from the group consisting of an indium-doped polysilicon, a sulfur-doped polysilicon, a sulfur-doped germanium and a selenium-doped germanium.

4. A protection circuit claimed in claim 2 wherein said resistor is formed of an indium-doped polysilicon containing the indium with a concentration of $1\times10^{16}cm^{-3}$.

5. A protection circuit claimed in claim 4 wherein said indium-doped polysilicon has a thickness of 500 nm, a width of 5 μm and a contact-to-contact distance of 100 μm.

6. A protection circuit claimed in claim 1 wherein said one of a semiconductor substrate and a reference potential well region is of a first conductivity type, and wherein said protection element means consists of two Schottky diodes formed on an impurity-doped well which is formed in said one of a semiconductor substrate and a reference potential well region and which is of a second conductivity type opposite to said first conductivity type, said two Schottky diodes being connected in series with each other but having a forward direction in a direction opposite to each other.

7. A protection circuit claimed in claim 6 wherein said impurity-doped well is formed of an N-type silicon well and each of said Schottky diodes is formed by a Schottky electrode in Schottky contact with said N-type silicon well.

8. A protection circuit claimed in claim 7 wherein said Schottky electrode is formed of one selected from the group consisting of molybdenum and molybdenum silicide.

* * * * *